United States Patent
Takahashi

(10) Patent No.: US 10,595,421 B2
(45) Date of Patent: Mar. 17, 2020

(54) PORTABLE OPERATION DEVICE

(71) Applicant: ALPS ALPINE CO., LTD., Tokyo (JP)

(72) Inventor: Ryo Takahashi, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 16/418,140

(22) Filed: May 21, 2019

(65) Prior Publication Data

US 2019/0274225 A1   Sep. 5, 2019

Related U.S. Application Data

(63) Continuation of application No. PCT/JP2017/032413, filed on Sep. 8, 2017.

(30) Foreign Application Priority Data

Jan. 23, 2017   (JP) .................................. 2017-009851

(51) Int. Cl.
*H05K 5/00* (2006.01)
*H05K 5/02* (2006.01)
(Continued)

(52) U.S. Cl.
CPC ............. *H05K 5/0086* (2013.01); *H01H 9/04* (2013.01); *H04Q 9/00* (2013.01); *H05K 5/0004* (2013.01); *H05K 5/02* (2013.01); *B60R 25/24* (2013.01)

(58) Field of Classification Search
None
See application file for complete search history.

(56) References Cited

U.S. PATENT DOCUMENTS

| | | | | |
|---|---|---|---|---|
| 2002/0012492 A1* | 1/2002 | Takahashi | ............ | G02B 6/2861 385/24 |
| 2003/0036959 A1* | 2/2003 | Takahashi | ............. | G06Q 30/02 705/14.73 |

(Continued)

FOREIGN PATENT DOCUMENTS

| | | |
|---|---|---|
| JP | H10-004273 | 1/1998 |
| JP | 2001-238326 | 8/2001 |

(Continued)

OTHER PUBLICATIONS

International Search Report dated Nov. 21, 2017 in PCT/JP2017/032413 filed on Sep. 8, 2017.

*Primary Examiner* — Courtney L Smith
*Assistant Examiner* — Rashen E Morrison
(74) *Attorney, Agent, or Firm* — IPUSA, PLLC

(57) ABSTRACT

A portable operation device includes a first housing at least partially covering an inner space, a second housing at least partially covering the inner space, an electronic component disposed in the inner space, and a waterproof sheet fixedly held between the first housing and the second housing, wherein the first housing includes a first facing portion that faces the second housing, and the second housing includes a second facing portion that faces the first housing, and wherein the waterproof sheet is interposed between, and in contact with, the first facing portion and the second facing portion, and at least one of the first facing portion and the second facing portion has an uneven surface facing the other.

2 Claims, 6 Drawing Sheets

(51) Int. Cl.
*H04Q 9/00* (2006.01)
*H01H 9/04* (2006.01)
*B60R 25/24* (2013.01)

(56) References Cited

U.S. PATENT DOCUMENTS

2006/0217008 A1* 9/2006 Higashino ............... A63F 13/10
439/894
2008/0081679 A1* 4/2008 Kawasaki ............ H04B 1/3888
455/575.8

FOREIGN PATENT DOCUMENTS

| JP | 2005-340682 | 12/2005 |
| JP | 2012-199183 | 10/2012 |
| JP | 2014-054034 | 3/2014 |

* cited by examiner

PORTABLE OPERATION DEVICE

CROSS-REFERENCE TO RELATED APPLICATIONS

This application is a continuation of International Application PCT/JP2017/032413, filed on Sep. 8, 2017 and designated the U.S., which is based on and claims priority to Japanese patent application No. 2017-009851 filed on Jan. 23, 2017, with the Japanese Patent Office. The entire contents of these applications are incorporated herein by reference.

BACKGROUND OF THE INVENTION

1. Field of the Invention

The disclosures herein relate to a portable operation device.

2. Description of the Related Art

A portable operation device performs various operations in response to user interaction with the device. An example of a portable operation device known in the art includes a keyless entry portable transmitter that controls the door key of a vehicle by wirelessly communicating with the vehicle as disclosed in Patent Document 1. The portable operation device disclosed in Patent Document 1 has a circuit module for controlling a vehicle key disposed inside a housing comprised of an upper case and a lower case. The portable operation device disclosed in Patent Document 1 also has a rubber sheet clamped between the upper case and the lower case to prevent water from entering the inner space.

In related-art portable operation devices in general, a rubber sheet for preventing water from entering the inner space is sandwiched and held between the flat faces of two housing parts. With this configuration, the force acting to separate the two housing parts holding the rubber sheet is constantly applied by the rubber sheet. There is thus a disadvantage in that the two housing parts holding the rubber sheet may be disassembled due to the force applied by the rubber sheet when the portable operation device is impacted upon being accidentally dropped, for example.

Accordingly, there may be a need for a portable operation device that is not readily disassembled upon being impacted.

RELATED-ART DOCUMENTS

Patent Document

[Patent Document 1] Japanese Patent Application Publication No. 2012-199183

SUMMARY OF THE INVENTION

It is a general object of the present invention to provide a portable operation device that substantially obviates one or more problems caused by the limitations and disadvantages of the related art.

According to an embodiment, a portable operation device includes a first housing at least partially covering an inner space, a second housing at least partially covering the inner space, an electronic component disposed in the inner space, and a waterproof sheet fixedly held between the first housing and the second housing, wherein the first housing includes a first facing portion that faces the second housing, and the second housing includes a second facing portion that faces the first housing, and wherein the waterproof sheet is interposed between, and in contact with, the first facing portion and the second facing portion, and at least one of the first facing portion and the second facing portion has an uneven surface facing the other.

According to at least one embodiment, a portable operation device that is not readily disassembled upon being impacted is provided.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

<Configuration>

Figure 1:
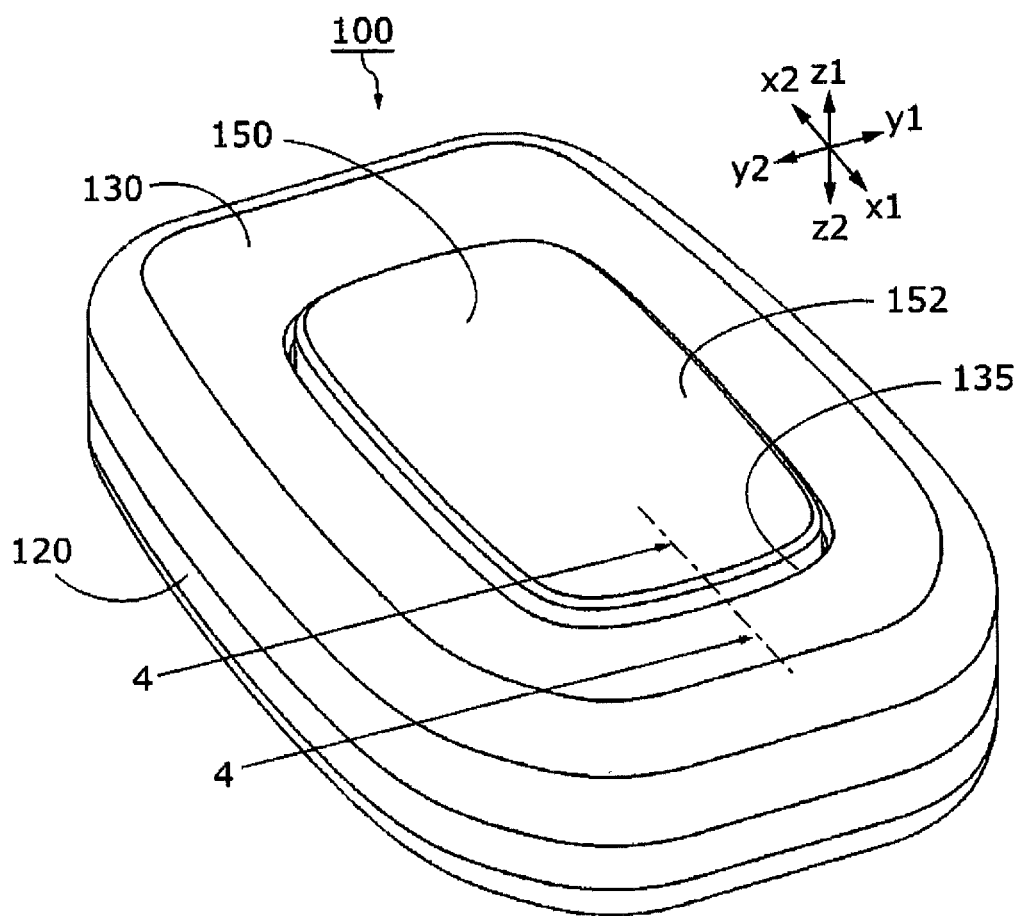
FIG. 1 is an axonometric view of a portable operation device according to an embodiment.
Figure 2:
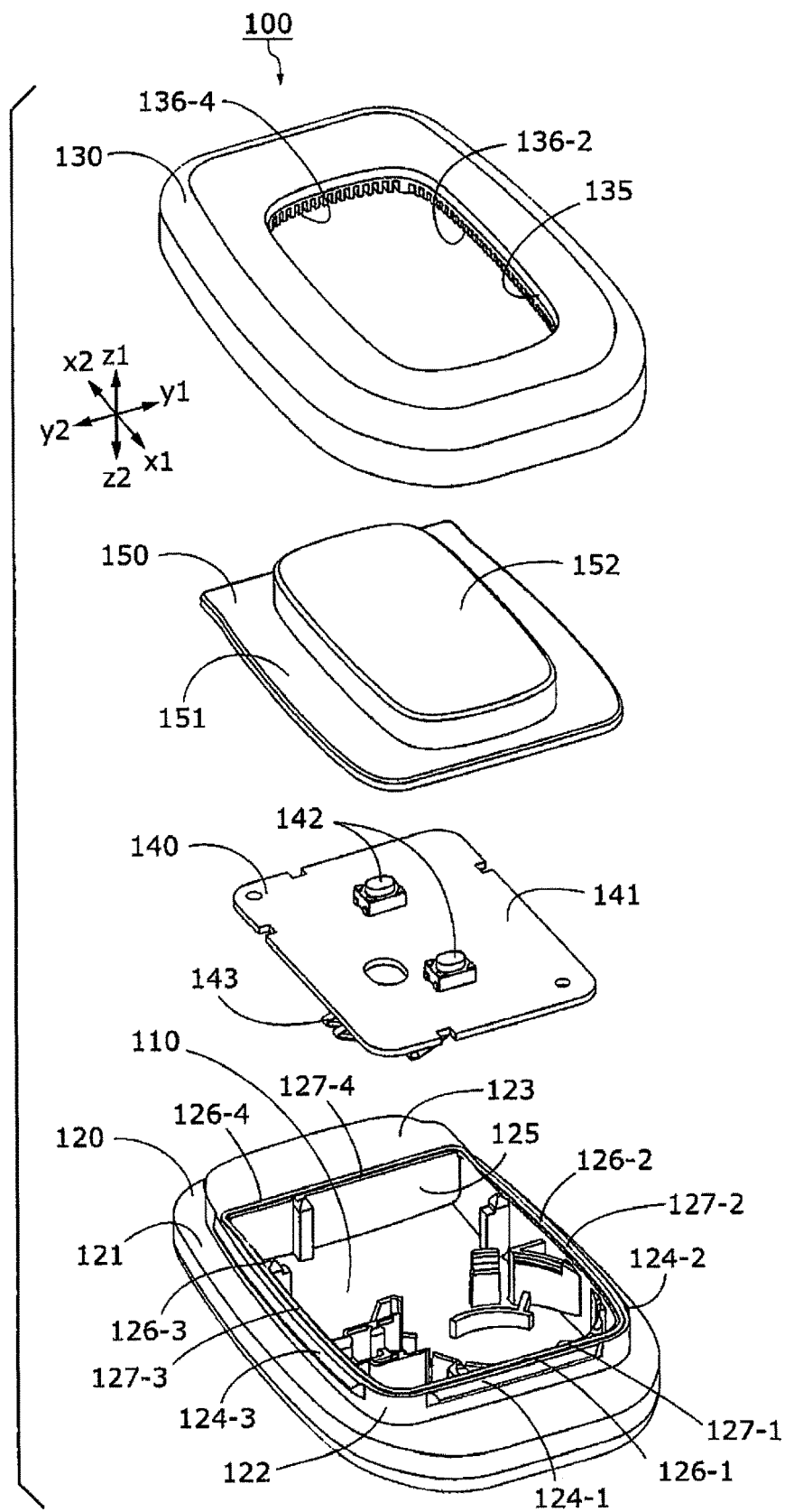
FIG. 2 is an exploded axonometric view of the portable operation device illustrated in FIG. 1, showing the z1 side thereof.
Figure 3:
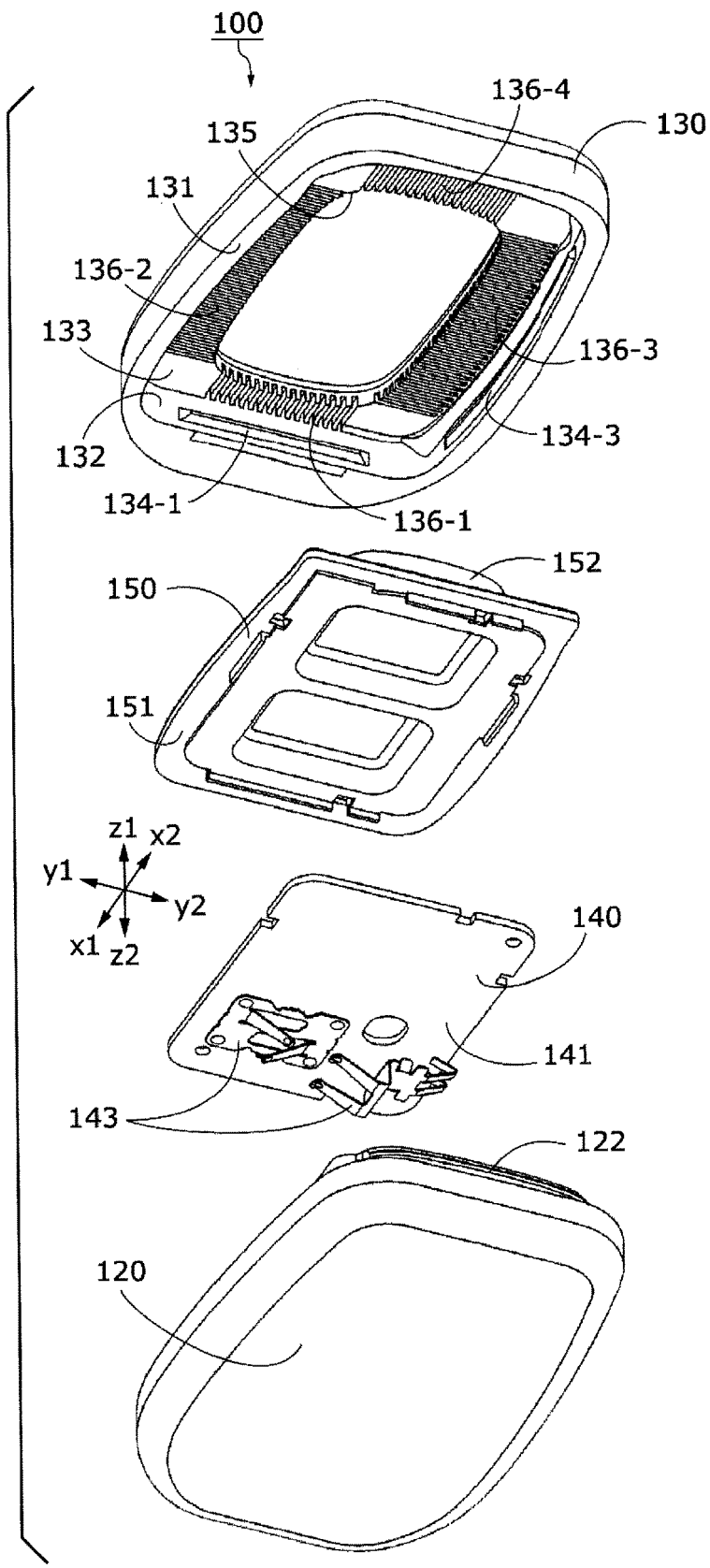
FIG. 3 is an exploded axonometric view of the portable operation device illustrated in FIG. 1, showing the z2 side thereof.

In the following, a portable operation device according to an embodiment will be described. FIG. 1 is an axonometric view of a portable operation device 100 according to a present embodiment. The portable operation device 100 unlocks and locks the door key of a vehicle by wirelessly communicating with the vehicle (not shown). The portable operation device 100 is of such a size as to be carried by hand. FIG. 2 is an exploded axonometric view of the portable operation device 100 showing the z1 side thereof. FIG. 3 is an exploded axonometric view of the portable operation device 100 showing the z2 side thereof.

In the present specification, the x direction, the y direction, and the z direction perpendicular to each other are defined. The x direction collectively refers to both the x1 direction and the x2 direction which are opposite to each other. The y direction collectively refers to both the y1 direction and the y2 direction which are opposite to each other. The z direction collectively refers to both the z1 direction and the z2 direction which are opposite to each other. In some cases, the z1 side may be referred to as the upper side, the z2 side as the lower side, the x1 side as the front side, the x2 side as the rear side, the y1 side as the right side, and the y2 side as the left side. These directions are defined for the sake of convenience in order to illustrate relative positional relationships, and do not limit positions or directions at the time of actual use. The shapes of components are not limited to precise geometric shapes represented by the terms used in descriptions, regardless of whether the term "substantially" or the like is used, as long as the technical concepts of the embodiments disclosed herein are realized.

As illustrated in FIG. 2, the portable operation device 100 includes a first housing 120 at least partially covering an inner space 110, a second housing 130 at least partially covering the inner space 110, an electronic component 140 contained in the inner space 110, and a waterproof sheet 150 secured between the first housing 120 and the second housing 130.

<First Housing>

As illustrated in FIG. 2, the first housing 120 is a flat member that extends generally in parallel to the xy plane. The first housing 120 is made of a resin. When viewed in the z2 direction, the first housing 120 has a frame-shaped first periphery part 121 extending along the perimeter. The first periphery part 121 has a surface substantially parallel to the xy plane.

The first housing 120 includes a protruding part 122 protruding in the z1 direction from the inner boundary of the first periphery part 121. The protruding part 122 has an upper face 123 substantially parallel to the xy plane on the z1 side thereof. The protruding part 122 has a substantially rectangular outer perimeter shape that has two sides substantially parallel to the x direction and two sides substantially parallel to the y direction as viewed in the z2 direction.

The protruding part 122 includes a first front engagement projection 124-1, a first right engagement projection 124-2, and a first left engagement projection 124-3 between the outer perimeter of the upper face 123 and the inner perimeter of the first periphery part 121. The first front engagement projection 124-1 resides in the y direction and projects from the x1-side face in the x1 direction. The first right engagement projection 124-2 resides in the x direction and projects from the y1-side face in the y1 direction. The first left engagement projection 124-3 resides in the x direction and projects from the y2-side face in the y2 direction.

The first housing 120 has a first recess 125 recessed from the upper face 123 in the z2 direction. The first recess 125 has a substantially rectangular outer perimeter shape that has two sides substantially parallel to the x direction and two sides substantially parallel to the y direction as viewed in the z2 direction.

The first housing 120 further includes a first front facing portion 126-1, a first right facing portion 126-2, a first left facing portion 126-3, and a first rear facing portion 126-4 (which may hereinafter be referred to as the first facing portion 126 without distinction), all of which project in the z1 direction from the upper face 123. The first front facing portion 126-1 is situated on the x1 side of the first recess 125 and resides (extends) generally in the y direction. The first rear facing portion 126-4 is situated on the x2 side of the first recess 125 and resides (extends) generally in the y direction. The first right facing portion 126-2 is situated on the y1 side of the first recess 125, and resides (extends) generally in the x direction between the y1-side end of the first front facing portion 126-1 and the y1-side end of the first rear facing portion 126-4. The first left facing portion 126-3 is situated on the y2 side of the first recess 125, and resides (extends) generally in the x direction between the y2-side end of the first front facing portion 126-1 and the y2-side end of the first rear facing portion 126-4. The first facing portion 126 surrounds the first recess 125 on the upper face 123 in a closed-loop manner.

Figure 4:
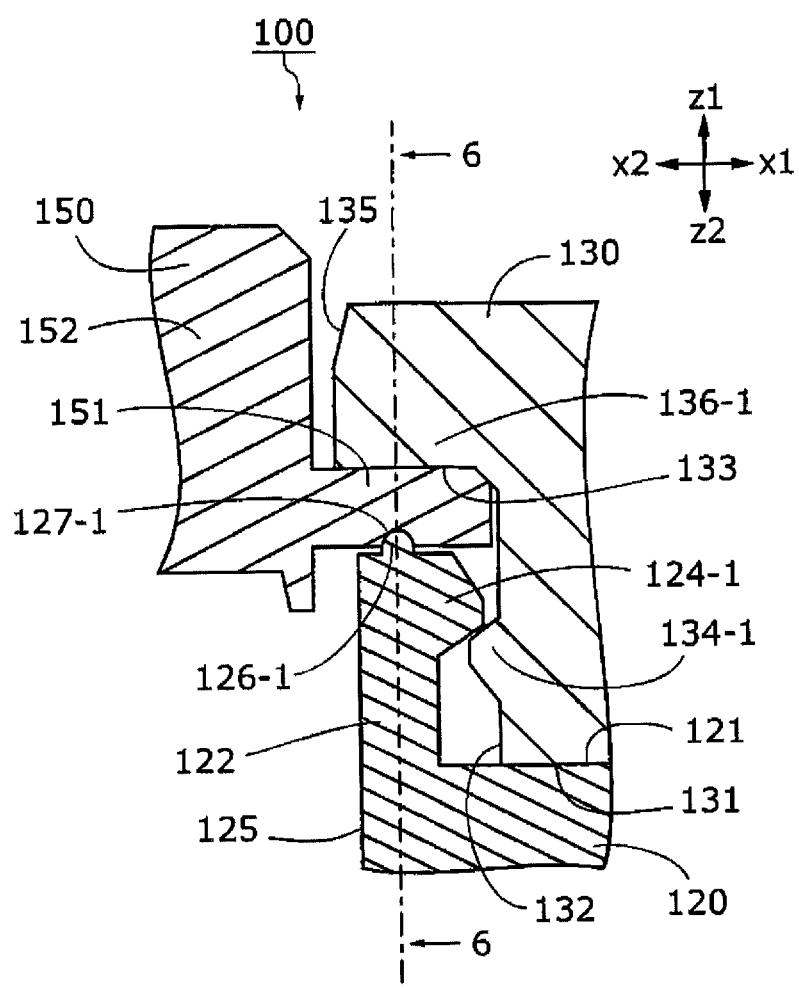
FIG. 4 is a partial cross-sectional view of the portable operation device taken along the line 4-4 in FIG. 1.

FIG. 4 is a partial cross-sectional view illustrating a cross-section, as viewed in the y1 direction, that is parallel to the zx plane and taken along a line 4-4 in FIG. 1. As illustrated in FIG. 4, the first front facing portion 126-1 has a first front contact surface 127-1 at the z1-side end. The cross-section of the first front contact surface 127-1 is approximately a z1-side half of a full circle, the width of which in the x direction gradually decreases toward the z1 direction. As illustrated in FIG. 2, the length of the first front facing portion 126-1 in the y direction is greater than the width of the first front facing portion 126-1 in the x direction. Also, the length, in the y direction, of the first front contact surface 127-1 extending in the y direction is greater than the width of the first front contact surface 127-1 in the x direction.

As illustrated in FIG. 2, the first right facing portion 126-2 has a first right contact surface 127-2. The first left facing portion 126-3 has a first left contact surface 127-3. The first rear facing portion 126-4 has a first rear contact surface 127-4. Hereinafter, the first front contact surface 127-1, the first right contact surface 127-2, the first left contact surface 127-3, and the first rear contact surface 127-4 may sometimes be referred to as the first contact surface 127 without distinction. When each part of the first contact surface 127 is viewed individually, the direction in which the first contact surface 127 extends may sometimes be referred to as a first direction. The first direction may be either the x direction or the y direction.

The first rear facing portion 126-4 and the first rear contact surface 127-4 are similar to what is obtained by rotating the first front facing portion 126-1 and the first front contact surface 127-1 180 degrees within the xy plane. The first right facing portion 126-2 and the first right contact surface 127-2 are similar to what is obtained by rotating the first front facing portion 126-1 and the first front contact surface 127-1 90 degrees counterclockwise within the xy plane, as viewed in the z2 direction. The first left facing portion 126-3 and the first left contact surface 127-3 are similar to what is obtained by rotating the first front facing portion 126-1 and the first front contact surface 127-1 90 degrees clockwise within the xy plane, as viewed in the z2 direction.

The first front contact surface 127-1 and the first rear contact surface 127-4 have substantially the same length in the y direction. The first right contact surface 127-2 and the first left contact surface 127-3 have substantially the same length in the x direction. The length of the first right contact surface 127-2 in the x direction is longer than the length of the first front contact surface 127-1 in the y direction.

<Second Housing>

As illustrated in FIG. 3, the second housing 130 is a flat member that extends generally in parallel to the xy plane. The second housing 130 is made of a resin. When viewed in the z1 direction, the second housing 130 has a frame-shaped second periphery part 131 extending along the perimeter. The second periphery part 131 has a surface substantially parallel to the xy plane.

The second housing 130 has a second recess 132 recessed in the z1 direction from the inner perimeter of the second periphery part 131. The second recess 132 has a substantially rectangular outer perimeter shape that has two sides substantially parallel to the x direction and two sides substantially parallel to the y direction as viewed in the z1 direction. The second recess 132 has, on the z1 side thereof, a ceiling face 133 that faces in the z2 direction and that is generally parallel to the xy plane. The ceiling face 133 has a substantially rectangular outer perimeter shape that has two sides extending substantially in the x direction and two sides extending substantially in the y direction as viewed in the z1 direction.

Figure 5:
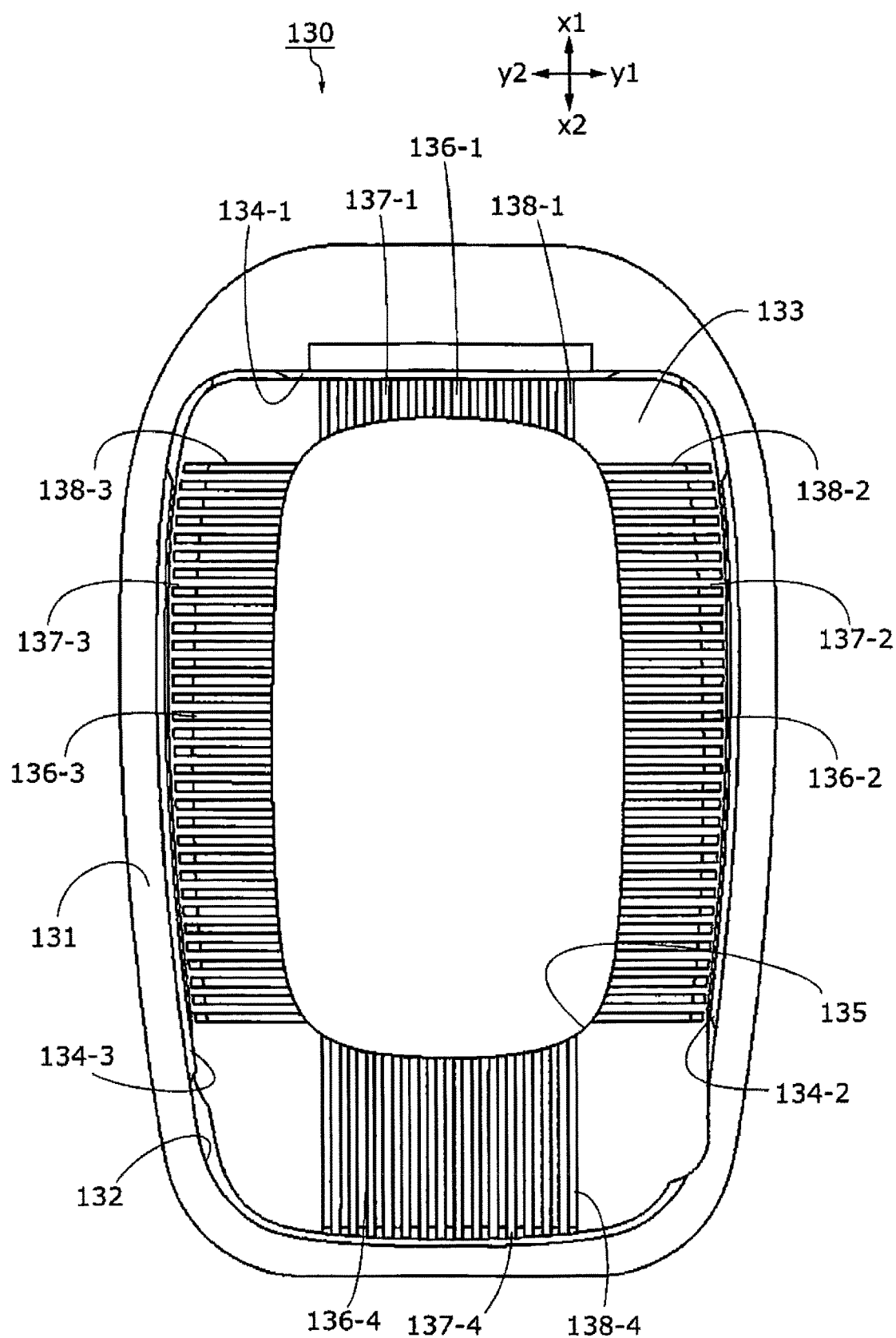
FIG. 5 is a bottom view of a second housing illustrated in FIG. 1 as viewed in the z1 direction.

FIG. 5 is a bottom view of the second housing 130 as viewed in the z1 direction. The second recess 132 includes a second front engagement projection 134-1, a first right engagement projection 134-2, and a first left engagement projection 134-3 between the outer perimeter of the ceiling face 133 and the inner perimeter of the second periphery part 131. The second front engagement projection 134-1 resides in the y direction and projects in the x2 direction from the x1-side inner face of the second recess 132. The second right engagement projection 134-2 resides in the x direction and projects in the y2 direction from the y1-side inner face of the second recess 132. The second left engagement projection 134-3 resides in the x direction and projects in the y1 direction from the y2-side inner face.

As illustrated in FIG. 3, the second housing 130 has a through-hole 135 that passes through the ceiling face 133 in the z direction. The ceiling face 133 surrounds the through-hole 135 in a closed-loop fashion as viewed in the z1 direction. The second housing 130 includes a second front facing portion 136-1, a second right facing portion 136-2, a second left facing portion 136-3, and a second rear facing portion 136-4 (which may hereinafter be referred to as the second facing portion 136 without distinction), all of which are uneven surfaces formed on the ceiling face 133.

As illustrated in FIG. 5, the second front facing portion 136-1 is situated on the x1 side of the through-hole 135, and has second front contact faces 137-1 that are substantially parallel to the xy plane. The second front facing portion 136-1 includes a plurality of front grooves 138-1 recessed in the z1 direction from the second front contact faces 137-1. In FIG. 5, only a representative one of the front grooves 138-1 is denoted with a reference number. The front grooves 138-1 extend in the x direction. The front grooves 138-1 are connected to the through-hole 135 at the x2-side end thereof. The front grooves 138-1 do not penetrate to the outside in the x1 direction.

Figure 6:
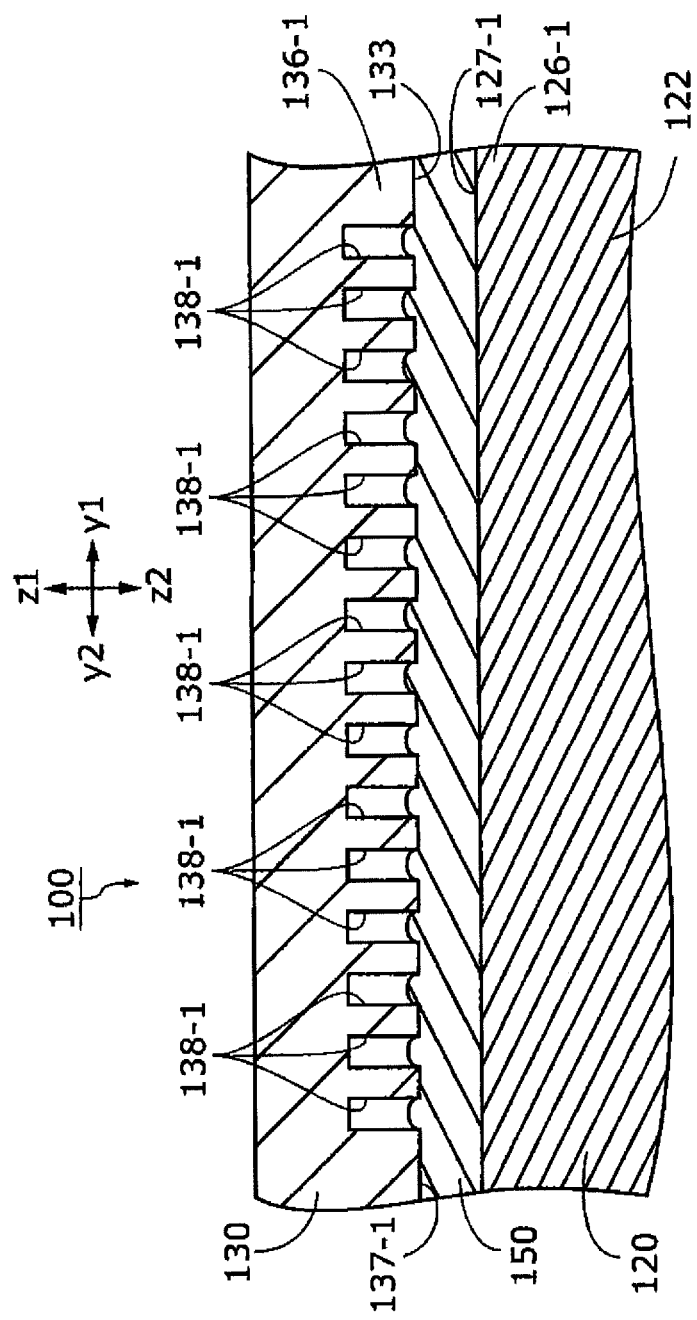
FIG. 6 is a partial cross-sectional view of the portable operation device taken along the line 6-6 in FIG. 4.

FIG. 6 is a partial cross-sectional view illustrating a cross-section, as viewed in the x2 direction, that is parallel to the yz plane and taken along a line 6-6 in FIG. 4. As illustrated in FIG. 6, the second front facing portion 136-1 includes the plurality of front grooves 138-1 recessed in the z1 direction from the second front contact faces 137-1. Each of the front grooves 138-1 has a generally rectangular cross-section with two sides substantially parallel to the y direction and two sides substantially parallel to the z direction. The front grooves 138-1 have substantially the same cross-section, and are equally spaced in the y direction. In the y direction, the interval between the front grooves 138-1 is approximately the same as the width of the front grooves 138-1.

The second front contact faces 137-1 and the front grooves 138-1 form at least a part of the uneven surface of the ceiling face 133. The second front facing portion 136-1 has the uneven surface extending in the y direction. In the present embodiment, the second front facing portion 136-1 includes 15 front grooves 138-1. In other instances, a different number of front grooves 138-1 may be provided.

As illustrated in FIG. 5, the second right facing portion 136-2 is situated on the y1 side of the through-hole 135. The second right facing portion 136-2 includes second right contact faces 137-2 substantially parallel to the xy plane, and includes a plurality of right grooves 138-2 that are recessed in the z1 direction from the second right contact faces 137-2. The second right facing portion 136-2, the second right contact faces 137-2, and the right grooves 138-2 are similar to what is obtained by rotating the second front facing portion 136-1, the second front contact faces 137-1, and the front grooves 138-1 90 degrees clockwise within the xy plane, as viewed in the z1 direction.

The second left facing portion 136-3 is situated on the y2 side of the through-hole 135. The second left facing portion 136-3 includes second left contact faces 137-3 substantially parallel to the xy plane, and includes a plurality of left grooves 138-3 that are recessed in the z1 direction from the second left contact faces 137-3. The second left facing portion 136-3, the second left contact faces 137-3, and the left grooves 138-3 are similar to what is obtained by rotating the second front facing portion 136-1, the second front contact faces 137-1, and the front grooves 138-1 90 degrees counterclockwise within the xy plane, as viewed in the z1 direction.

The second rear facing portion 136-4 is situated on the x2 side of the through-hole 135. The second rear facing portion 136-4 includes second rear contact faces 137-4 substantially parallel to the xy plane, and includes a plurality of rear grooves 138-4 that are recessed in the z1 direction from the second rear contact faces 137-4. The second rear facing portion 136-4, the second rear contact faces 137-4, and the rear grooves 138-4 are similar to what is obtained by rotating the second front facing portion 136-1, the second front contact faces 137-1, and the front grooves 138-1 180 degrees within the xy plane.

Hereinafter, the second front contact faces 137-1, the second right contact faces 137-2, the second left contact faces 137-3, and the second rear contact faces 137-4 may sometimes be referred to as the second contact surface 137 without distinction. The front grooves 138-1, the right grooves 138-2, the left grooves 138-3, and the rear grooves 138-4 may be referred to as the grooves 138 without distinction. When the grooves 138 and the first contact surface 127 facing each other are viewed locally, the direction in which the grooves 138 extend may be referred to as the second direction in relation to the first direction in which the first contact surface 127 extends.

<Electronic Component>

As illustrated in FIG. 2 and FIG. 3, the electronic component 140 includes a circuit board 141, two switches 142, and two metal terminals 143. The electronic component 140 may be constituted by other components such as batteries, wires, resistive elements, semiconductor chips, and the like.

<Waterproof Sheet>

As illustrated in FIG. 2, the waterproof sheet 150 includes a frame-shaped plate part 151 extending substantially in parallel to the xy plane and a protruding part 152 protruding in the z1 direction from the inner perimeter of the plate part 151. The waterproof sheet 150 is made of a water-impermeable rubber, and is softer than both the first housing 120 and the second housing 130.

<Relative Relationship>

As illustrated in FIG. 1, the second housing 130 is situated on the z1 side of the first housing 120. The protruding part 122 of the first housing 120 illustrated in FIG. 2 is situated in the second recess 132 of the second housing 130 illustrated in FIG. 3. The first periphery part 121 of the first housing 120 illustrated in FIG. 2 is in contact with the second periphery part 131 of the second housing 130 illustrated in FIG. 3.

As illustrated in FIG. 4, the first front engagement projection 124-1 is situated on the z1 side of the second front engagement projection 134-1. Similarly, the first right engagement projection 124-2 (FIG. 2) is situated on the z1 side of the second right engagement projection 134-2 (FIG. 5). The first left engagement projection 124-3 (FIG. 2) is situated on the z1 side of the second left engagement projection 134-3 (FIG. 5). Accordingly, unless a strong force is applied, the first front engagement projection 124-1, the first right engagement projection 124-2, and the first left engagement projection 124-3 are not removed in the z2 direction from the second housing 130.

The first facing portion 126 of the first housing 120 illustrated in FIG. 2 face the second facing portion 136 of the second housing 130 illustrated in FIG. 3. More specifically, the first contact surface 127 illustrated in FIG. 2 partially face the second contact surface 137 illustrated in FIG. 3. The waterproof sheet 150 is sandwiched between the first facing portion 126 and the second facing portion 136 while the waterproof sheet 150 is in contact with both the first contact surface 127 illustrated in FIG. 2 and the second contact surface 137 illustrated in FIG. 3. As illustrated in FIG. 1, the protruding part 152 of the waterproof sheet 150 is situated in the through-hole 135 of the second housing 130, and protrudes in the z1 direction from the z2 side. The plate part 151 of the waterproof sheet 150 illustrated in FIG. 2 is sandwiched in the z direction, and fixedly held, between the first facing portion 126 of the first housing 120 illustrated in FIG. 2 and the ceiling face 133 of the second housing 130 illustrated in FIG. 3.

As illustrated in FIG. 4, the x1-side part of the plate part 151 is situated, in the z-direction, between the first front facing portion 126-1 and the second front facing portion 136-1. The first front contact surface 127-1 of the first front facing portion 126-1 is forced firmly into the plate part 151, which provides tight contact therebetween. The waterproof sheet 150 extends to both sides of the first front contact surface 127-1 in the x direction.

As illustrated in FIG. 6, the first front contact surface 127-1 is in contact with the waterproof sheet 150 continuously without gaps in the y direction. The waterproof sheet 150 is in contact with the second front contact faces 137-1 without gaps in the y-direction, except for the positions of the front grooves 138-1. The front grooves 138-1 are recessed from the second front contact faces 137-1 in a direction away from the first front contact surface 127-1. The waterproof sheet 150 bulges into the front grooves 138-1 by the force that fastens the first housing 120 and the second housing 130 with each other. Each of the front grooves 138-1 extends in the x direction on both sides of the area that faces the first front contact surface 127-1 (see FIG. 4).

The portion of the plate part 151 on the y1 side is situated between the first right facing portion 126-2 (FIG. 2) and the second right facing portion 136-2 (FIG. 3). The plate part 151, the first right facing portion 126-2 (FIG. 2), and the second right facing portion 136-2 (FIG. 3) are similar to what is obtained by rotating the plate part 151, the first front facing portion 126-1 (FIG. 2), and the second front facing portion 136-1 (FIG. 3) 90 degrees counterclockwise within the xy plane, as viewed in the z2 direction.

The portion of the plate part 151 on the y2 side is situated between the first left facing portion 126-3 (FIG. 2) and the second left facing portion 136-3 (FIG. 3). The plate part 151, the first left facing portion 126-3 (FIG. 2), and the second left facing portion 136-3 (FIG. 3) are similar to what is obtained by rotating the plate part 151, the first front facing portion 126-1 (FIG. 2), and the second front facing portion 136-1 (FIG. 3) 90 degrees clockwise within the xy plane, as viewed in the z2 direction.

The portion of the plate part 151 on the x2 side is situated between the first rear facing portion 126-4 (FIG. 2) and the second rear facing portion 136-4 (FIG. 3). The plate part 151, the first rear facing portion 126-4 (FIG. 2), and the second rear facing portion 136-4 (FIG. 3) are similar to what is obtained by rotating the plate part 151, the first front facing portion 126-1 (FIG. 2), and the second front facing portion 136-1 (FIG. 3) 180 degrees within the xy plane.

In another example, at least one of the first facing portion 126 and the second facing portion 136 may have an uneven surface facing the other. Namely, the first facing portion 126 in another example may have an uneven surface similar to that of the second facing portion 136 of the present embodiment. Alternatively, both the first facing portion 126 and the second facing portion 136 in another example may have uneven surfaces similar to that of the second facing portion 136 of the present embodiment.

The electronic component 140 is fixedly mounted in the inner space 110 formed between the first recess 125 of the first housing 120 and the second housing 130. The electronic component 140 is disposed within the inner space 110 between the first housing 120 and the waterproof sheet 150. The waterproof sheet 150 secured between the first housing 120 and the second housing 130 prevents water at the outside from entering the inner space 110 in which the electronic component 140 is disposed.

<Summary>

According to the present embodiment, at least one of the first facing portion 126 and the second facing portion 136 has an uneven surface facing the other, so that the waterproof sheet 150 deforms and enters depressions in the uneven surface. With this arrangement, the pressure applied to the first housing 120 and the second housing 130 by the waterproof sheet 150 is reduced compared to the case in which none of the first facing portion 126 and the second facing portion 136 has an uneven surface, so that the portable operation device 100 is not readily disassembled upon being impacted.

According to the present embodiment, the first facing portion 126 has the first contact surface 127 facing the second facing portion 136, and the first contact surface 127 extends in the first direction, such that the length of the first contact surface 127 in the first direction is greater than the width of the first contact surface 127 in a direction substantially perpendicular to the first direction. The second facing portion 136 has at least a part of the uneven surface in the first direction, and the waterproof sheet 150 extends on both sides of the first contact surface 127 in a direction substantially perpendicular to the first direction, so that the first facing portion 126 is readily forced into the waterproof sheet 150. As a result, force is dispersed to make the portable operation device 100 less likely to be disassembled upon impact, while the waterproof performance is improved.

According to the present embodiment, the second facing portion 136 has the second contact surface 137 facing the first contact surface 127, and also has the plurality of grooves 138 recessed from the second contact surface 137 in a direction away from the first contact surface 127. The second contact surface 137 and the grooves 138 constitute at least a part of the uneven surface, and each of the grooves 138 extends in the second direction, intersecting the first direction, on both sides of the area that faces the first contact surface 127. The waterproof sheet 150 is in contact with the second contact surface 137, so that the compressed waterproof sheet 150 bulges into the grooves 138. Accordingly, the elastic force applied by the waterproof sheet 150 to the first housing 120 and the second housing 130 is relaxed compared to the case in which the waterproof sheet 150 is sandwiched between two flat surfaces, so that the portable operation device 100 is less likely to be disassembled upon impact. In addition, the waterproof sheet 150 is forced firmly into the grooves 138, which enhances the waterproof performance. Further, because the first direction in which the first contact surface 127 extends intersects the second direction in which the grooves 138 extend, the waterproof sheet 150 is reliably clamped even when the relative position between the first contact surface 127 and the second contact surface 137 varies due to manufacturing errors or the like. This ensures that the portable operation device 100 is less likely to be disassembled upon impact.

According to the present embodiment, the waterproof sheet 150 is made of a rubber, so that the waterproof sheet 150 is readily forced into the uneven surface. Consequently, the portable operation device 100 is less likely to be disassembled upon impact than when a more rigid material than a rubber is used for the waterproof sheet 150.

The present invention is not limited to the embodiments described heretofore. Namely, a person having ordinary skill in the art may make various modifications, combinations, subcombinations, and alternatives with respect to the components of the embodiments described above, within the scope of the invention or within the equivalent thereof.

The present invention is applicable to various devices that have two members having a waterproof sheet placed therebetween to protect an embedded electronic component.

What is claimed is:

1. A portable operation device, comprising:
    a first housing at least partially covering an inner space;
    a second housing at least partially covering the inner space;
    an electronic component disposed in the inner space; and
    a waterproof sheet fixedly held between the first housing and the second housing,
    wherein the first housing includes a first facing portion that faces the second housing, and the second housing includes a second facing portion that faces the first housing, and
    wherein the waterproof sheet is interposed between, and in contact with, the first facing portion and the second facing portion, and at least one of the first facing portion and the second facing portion has an uneven surface facing the other,
    wherein the first facing portion has a first contact surface that faces the second facing portion, the first contact surface extending in a first direction, a length of the first contact surface in the first direction being greater than a width of the first contact surface in a direction substantially perpendicular to the first direction,
    wherein the second facing portion includes at least a part of the uneven surface in the first direction, and the waterproof sheet extends on both sides of the first contact surface in the direction substantially perpendicular to the first direction,
    wherein the second facing portion includes both a second contact surface that faces the first contact surface and a plurality of grooves recessed from the second contact surface in a direction away from the first contact surface, and the second contact surface and the plurality of grooves constitute at least a part of the uneven surface, and
    wherein each of the plurality of grooves extends, on both sides of an area that faces the first contact surface, in a second direction intersecting the first direction, and the waterproof sheet is in contact with the second contact surface.

2. The portable operation device as claimed in claim 1, wherein the waterproof sheet is made of a rubber.

* * * * *